(12) United States Patent
Chien

(10) Patent No.: US 6,566,166 B2
(45) Date of Patent: May 20, 2003

(54) METHOD OF MANUFACTURING A CAVITY-DOWN PLASTIC BALL GRID ARRAY (CD-PBGA) SUBSTRATE

(75) Inventor: Ray Chien, Taipei (TW)

(73) Assignee: VIA Technologies Inc., Hsin-Tien (TW)

( * ) Notice: Subject to any disclaimer, the term of this patent is extended or adjusted under 35 U.S.C. 154(b) by 119 days.

(21) Appl. No.: 09/828,858

(22) Filed: Apr. 10, 2001

(65) Prior Publication Data

US 2002/0009826 A1 Jan. 24, 2002

(30) Foreign Application Priority Data

Apr. 14, 2000 (TW) .......................................... 089106982

(51) Int. Cl.[7] .............................................. H01L 21/44
(52) U.S. Cl. ...................... 438/108; 438/613; 257/778; 257/780
(58) Field of Search ................................. 257/778, 780; 438/108, 613

(56) References Cited

U.S. PATENT DOCUMENTS

| | | | |
|---|---|---|---|
| 4,783,421 A | * 11/1988 | Carlson et al. ............. | 257/447 |
| 5,027,191 A | * 6/1991 | Bourdelaise et al. ........ | 257/735 |
| 5,420,460 A | * 5/1995 | Massingill .................. | 257/693 |
| 5,583,378 A | * 12/1996 | Marrs et al. ................ | 257/710 |
| 5,840,598 A | * 11/1998 | Grigg et al. ................ | 156/326 |
| 6,395,582 B1 | * 5/2002 | Sohn et al. ................. | 438/111 |
| 6,440,777 B2 | * 8/2002 | Cobbley et al. ............ | 438/118 |
| 2002/0124955 A1 | * 9/2002 | Tung et al. ................. | 156/300 |

\* cited by examiner

Primary Examiner—Richard Elms
Assistant Examiner—Christian D. Wilson
(74) Attorney, Agent, or Firm—Winston Hsu

(57) ABSTRACT

An organic substrate and a heat spreader are separately made, and are then combined with a partially cured liquid-type adhesive layer. In making the organic substrate, a solder mask and a cavity as a pocket for an IC die are first formed on one side of an organic substrate. A pre-treatment process is performed to a copper layer on the opposite side of the organic substrate. A black ink layer is layered on one side of the heat spreader, and a second black ink layer is formed within a predetermined area on its opposite side. The predetermined area is reserved for positioning the IC die, and has a plurality of heat dissipating pads. A liquid-type adhesive printing process and a partial curing process are performed, which forms a solidified liquid-type adhesive layer outside of the predetermined area. The organic substrate is then laminated to the Cu heat spreader under high temperatures. Finally, a Ni/Au layer is plated onto a plurality of conductive pads and heat dissipating pads of the substrate.

17 Claims, 10 Drawing Sheets

METHOD OF MANUFACTURING A CAVITY-DOWN PLASTIC BALL GRID ARRAY (CD-PBGA) SUBSTRATE

BACKGROUND OF THE INVENTION

1. Field of the Invention

The present invention relates to a method of manufacturing a substrate, particularly to a cavity-down plastic ball grid array (CD-PBGA) substrate.

2. Description of the Prior Art

With the sophistication of IC devices, the complexity of semiconductor dies has increased, leading to a greater number of slots for electric signals, plug-switches and conductive lines. This has lead to a variety of high-density substrates for packaging semiconductor dies, including CD-PBGA substrates. CD-PBGA substrates are used for ball grid array packaging, which has a excellent thermal dissipation characteristics. The traditional CD-PBGA substrate has between 300 to 800 ball counts, with an operating power of 5 to 10 watts or higher. The thermal dissipation capabilities of a CD-PBGA substrate can be improved using forced-air convection, such as by adding a cooling fan to the top of the CD-PBGA substrate with attached heat slug.

There are many prior art inventions in the field of cavity-down ball grid arrays (CD-BGA). For example, U.S. Pat. No. 5,027,191 provides a cavity-down padding array substrate for packaging a semiconductor die, and U.S. Pat. No. 5,420,460 provides a thin CD-BGA packaging structure for wire bonding.

Please refer to FIG. 1 and FIG. 2. FIG. 1 is a diagram of a traditional CD-PBGA substrate 10, and FIG. 2 is a cross-sectional view of the CD-PBGA substrate 10 of FIG. 1. The CD-PBGA substrate 10 made according to the prior art comprises an organic substrate 12 and a Cu heat spreader 14. The organic substrate 12 has in its center a squared or rectangular cavity for holding an IC die 18. When the CD-PBGA 10 is positioned on a printed circuit board (PCB), the Cu heat spreader 14 will be positioned on top away from the printed circuit board so as to facilitate heat radiation.

As shown in FIG. 1 and FIG. 2, one side of the organic substrate 12 comprises a plurality of bonding fingers 20, solder ball pads 22, and conductive interconnects 23 (FIG. 1 only shows a portion of the conductive interconnects 23) for electrically connecting the bonding fingers 20 to the solder ball pads 22. The organic substrate 12 has a Cu layer (Cu interconnects layer) 24 on its opposite side, and it has a plurality of conductive vias 26 for electrically connecting the bonding fingers 20, the ball pads 22, and the conductive interconnects 23 to the Cu layer 24. A solder mask 28 covers the organic substrate 12 to protect the packaging substrate 10, to isolate the conductive pads 20 and 22, and to insulate the conductive interconnects 23. The surface of each conductive pad 20, 22 is plated with a layer of nickel 30 and a layer of gold 32. An adhesive layer 34 is used to bind the organic substrate 12 to the Cu heat spreader 14. The adhesive layer 34 is usually an epoxy-based prepreg. Additionally, the surface of the Cu heat spreader has a Ni-plated finish 36 for protecting the Cu heat spreader 14 and to prevent oxidation.

After the IC die 18 is fitted, with the help of epoxy, into the cavity 16 of the substrate 10, the IC die 18 is, by wire bonding, electrically connected to the bonding fingers 20 through a plurality of conductive interconnects 38. The cavity 16 is then filled to seal in the IC die 18. A Pb/Sn or Sn solder ball 40 is fixed onto each of the solder ball pads 22, in order to bond the substrate 10 to the printed circuit board (not shown). Signals from the IC die 18 are transmitted through the conductive interconnects 38 to the bonding fingers 20 of the substrate 10, and through the conductive interconnects 23 to the solder ball pads 22 (or following a route from the conductive interconnects 23 to the conductive vias 26, the Cu interconnects layer 24, the conductive vias 26, and to the conductive interconnects 23). Finally, current from the IC die 18 is transmitted to the printed circuit board through the solder balls 40. Following the same route in reverse, signals are transmitted back to the IC die 18 from the printed circuit board.

The method of manufacturing the substrate 10 according to the prior art is to first separately make the organic substrate 12 and the Cu heat spreader 14, and then to combine the two. According to the conventional method, the bonding fingers 20, the solder ball pads 22, the conductive interconnects 23, Cu conductive interconnects layer 24 and the conductive vias 26 are made on the organic substrate 12 without the cavity 16. The solder mask 28 is then coated onto the substrate 12 on the same side as the ball pads 22 and bonding fingers 20. An etching process is performed to transfer an appropriate pattern to the solder mask 28.

After the solder mask 28 is made, a tape or film (not shown) is adhered to the other side of the organic substrate 12 (the same side as the Cu interconnects layer 24) before performing a single-sided Ni/Au plating process (on the same side as the conductive interconnects 23). The plating process is performed by plating each of the conductive pads 20 and 22 of the organic substrate 12 with a Ni layer 30 that is approximately 5 microns thick, and over which is plated a gold layer 32 that is approximately 0.5 microns thick. Upon the completion of the plating process, the tape or film is removed, and a squared or rectangular cavity 16 is cut into the center of the organic substrate 12, followed by a cleaning process.

After cutting out the cavity 16, the manufacturer performs a single-sided Cu surface pre-treatment. An oxide layer 42 is formed over the Cu layer 24 of the organic substrate 12 in order to increase the surface adhesion of the organic substrate 12 by utilizing the coarse nature of the oxide layer 42. The oxide layer 42 can comprise black oxide or brown oxide.

When making the organic substrate 12, the manufacturer can at the same time fix a tape or a dry film (not shown) onto one side of the Cu heat spreader 14 before performing a single-side Ni plating process on the opposite side. After the Ni-plated finish 36 is formed, the tape or dry film is removed from the Cu heat spreader 14, and another single-side Cu surface pretreatment process is performed, in which an oxide layer 44 is formed on one side (the same side as the Ni-plated finish 36) of the Cu heat spreader 14 to increase the surface adhesion of the Cu heat spreader. The oxide layer 44 may comprise black oxide or brown oxide.

Please refer to FIG. 3 and FIG. 4. FIG. 3 shows the thermal laminating process in making the substrate 10 according to the prior art, and FIG. 4 is a view of removing a release film 48 and a filler film 46 after completing the thermal laminating process. After the organic substrate 12 and the Cu heat spreader 14 are made as described above, a thermal laminating process is performed to laminate the two pieces.

As shown in FIG. 3, a filler film 46 is fixed onto the organic substrate 12 to prevent the sticky adhesive layer 34 from flowing into the cavity 16 during the thermal laminating process. The filler film 46 may comprise polyethylene or silicone rubber. After the completion of the thermal laminating process, the filler film 46 must be removed completely, so before placing the filler film 46, the manufacturer places a release film 48 over the organic substrate 12. The release film 48 can be peeled from the organic substrate afterwards so as to help with the removal of the filler film 46.

Before performing the thermal laminating process, in addition to placing the release film 48 and the filler film 46, the manufacturer must also cut a cavity 50 in the center of the sticky adhesive layer 34 that corresponds to the cavity 16 to prevent the sticky adhesive layer 34 from remaining in the cavity 16 when the substrate 10 is completed.

After the preparations described above are completed, the filler film 46, the organic substrate 12 with the cavity 16, the adhesive layer 34 with the cavity 50 and the Cu heat spreader 14 are laid over one another and undergo a thermal laminating process to form the substrate 10. As shown in FIG. 4, the releasing film 48 is peeled from the substrate 10, which also removes the filler film 46. A thermal treatment process is then performed on the substrate 10 so as to control the warpage of the substrate 10 and to further cure the adhesive layer 34, tightly binding the organic substrate 12 and the Cu heat spreader 14 together.

So far, the substrate 10 is made by manufacturing a plurality of CD-PBGA substrates on a single substrate sheet (not shown). The substrate sheet is then cut into many individual substrates 10. The manufacturer can either form a plurality of tooling holes before or after laminating the substrate sheet, depending on the manufacturing needs. After cutting, the manufacturer inspects each substrate 10 to ensure that each substrate 10 conforms to industrial standards.

There are, however, several problems in this prior art method of making the CD-PBGA substrate 10:

1. Before plating Ni on one side of the Cu heat spreader 14, the manufacturer must fix a tape or film on its opposite side and then remove it after the plating process is done. Both the fixing and removing processes complicate the Ni plating process and result in high production cost.
2. The Ni plated layer 36 on the Cu heat spreader 14 is a source of high stress to the Cu heat spreader 14, affecting the warpage of the substrate 10, and may result in unevenness in the substrate 10.
3. The coefficient of thermal expansion (CTE) of a typical epoxy compound that is used to bind the IC die 18 is between 50 to 60 ppm/° C. The CTE of the Cu heat spreader is about 17 ppm/° C. These two values are not match to each other. In subsequent packaging processes, and in the process of soldering the substrate 10 to a printed circuit board, the substrate suffers high temperatures. The temperature of the IC die 18 rises during these processes. The high temperatures affect the epoxy compound and the Cu heat spreader 14 differently, resulting in a higher stress in the epoxy compound (underneath the IC die 18). The epoxy compound is thus not being able to effectively reduce the stress between the IC die 18 and the Cu heat spreader 14.
4. In manufacturing the substrate 10 according to the prior art, the Ni-plated finish 30 and the gold-plated finish 32 on the bonding fingers 20 and on the solder ball pads 22 are formed prior to the thermal lamination process. This increases the possibility of contamination or deterioration of the surface of the gold-plated finish 32.
5. According to the prior art, the adhesive layer 34 with its cavity 50 is used to bind the organic substrate 12 and the Cu heat spreader 14, but the process of making a precise cavity 50 is difficult and expensive. Additionally, to precisely align the organic substrate 12 having cavity, the adhesive layer 34 having cavity and the Cu heat spreader 14 is also a difficult task. Also, the application of the releasing film 48 and the filler film 46 in the thermal laminating process is inconvenient and uneconomical.

SUMMARY OF THE INVENTION

It is therefore a primary objective of the present invention to provide a method of manufacturing a CD-PBGA substrate to correct the weaknesses described above and to reduce production costs.

In a preferred embodiment, the present invention comprises an organic substrate and a heat spreader. The method involves first making an organic substrate and a heat spreader separately, and to then combine the two parts with a partially cured liquid-type adhesive layer. In making the organic substrate, a solder mask layer is first formed on one side of an organic substrate, then a cavity for holding an IC die is cut out. A surface pre-treatment process is then performed on the copper layer on the opposite side. A black ink layer is layered on one side of the heat spreader, and a second black ink layer is formed within a predetermined area on the opposite side. The predetermined area is reserved for positioning the IC die, and has a plurality of heat dissipating pads. Next, a liquid adhesive printing or coating process and a partial curing process are performed, which forms a solidified liquid-type adhesive layer outside the predetermined area of the Cu heat spreader. The organic substrate is then laminated to the Cu heat spreader at a high temperature. Finally, a Ni/Au layer is simultaneously plated onto a plurality of conductive pads and heat dissipating pads, fingers of the substrate.

It is an advantage of the present invention that performing the thermal lamination process before the Ni/Au plating process reduces the possibility of damage and contamination to the gold plating of the Ni/Au finish. The black ink layer is formed on the Cu heat spreader by way of a stencil printing process or other coating process, so that the process does not require any tapes or films to cover one side of the Cu heat spreader (for the purpose of single-side Ni plating), thus reducing production costs. Also, the use of a stencil-printed liquid-type adhesive layer to bind the organic substrate to the Cu heat spreader further simplifies the manufacturing process and reduces the materials used.

These and other objectives of the present invention will no doubt become obvious to those of ordinary skill in the art after reading the following detailed description of the preferred embodiment, which is illustrated in the various figures and drawings.

DETAILED DESCRIPTION OF THE PREFERRED EMBODIMENT

Figure 1:
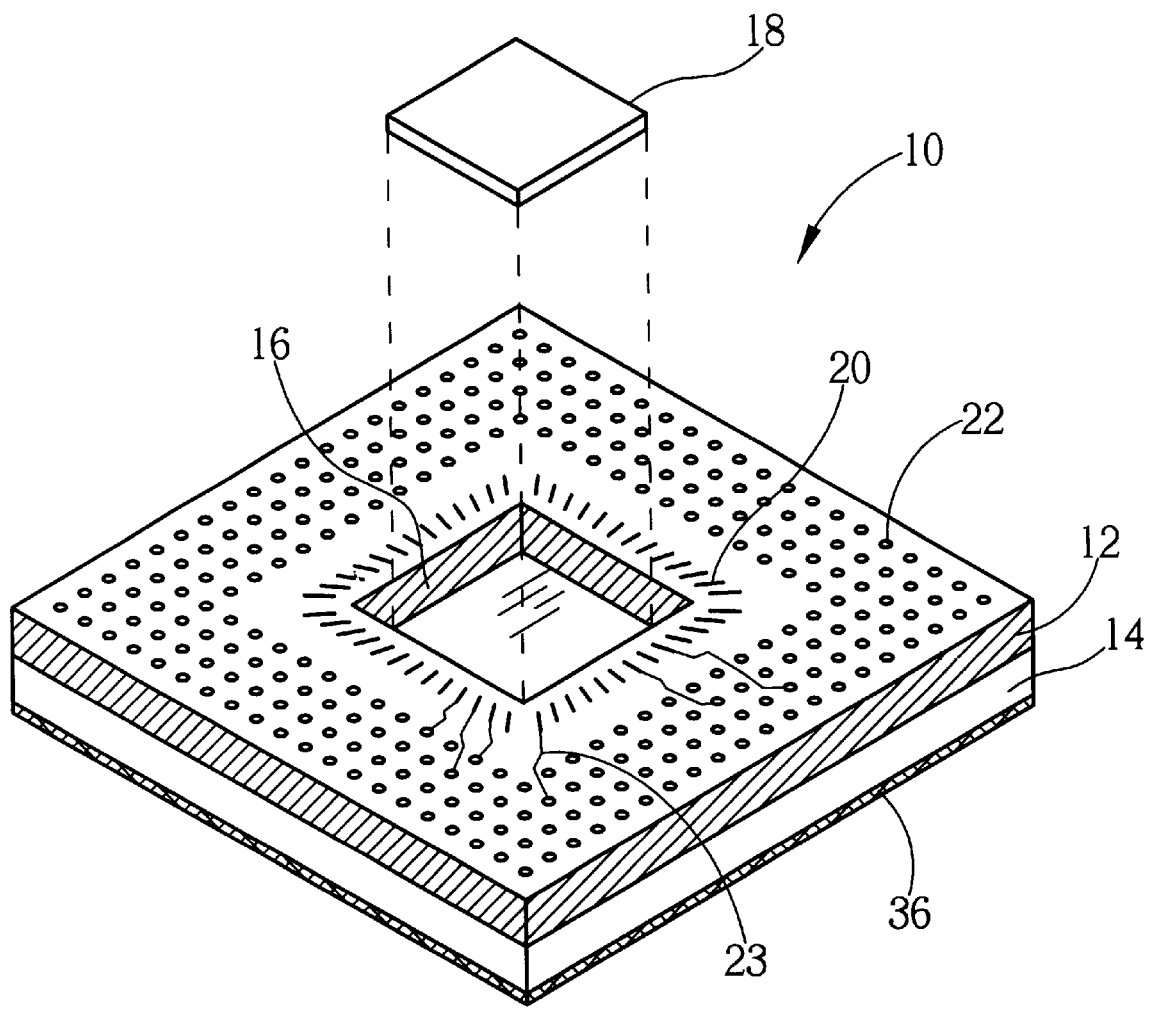
FIG. 1 is a view of a CD-PBGA substrate according to the prior art.
Figure 2:
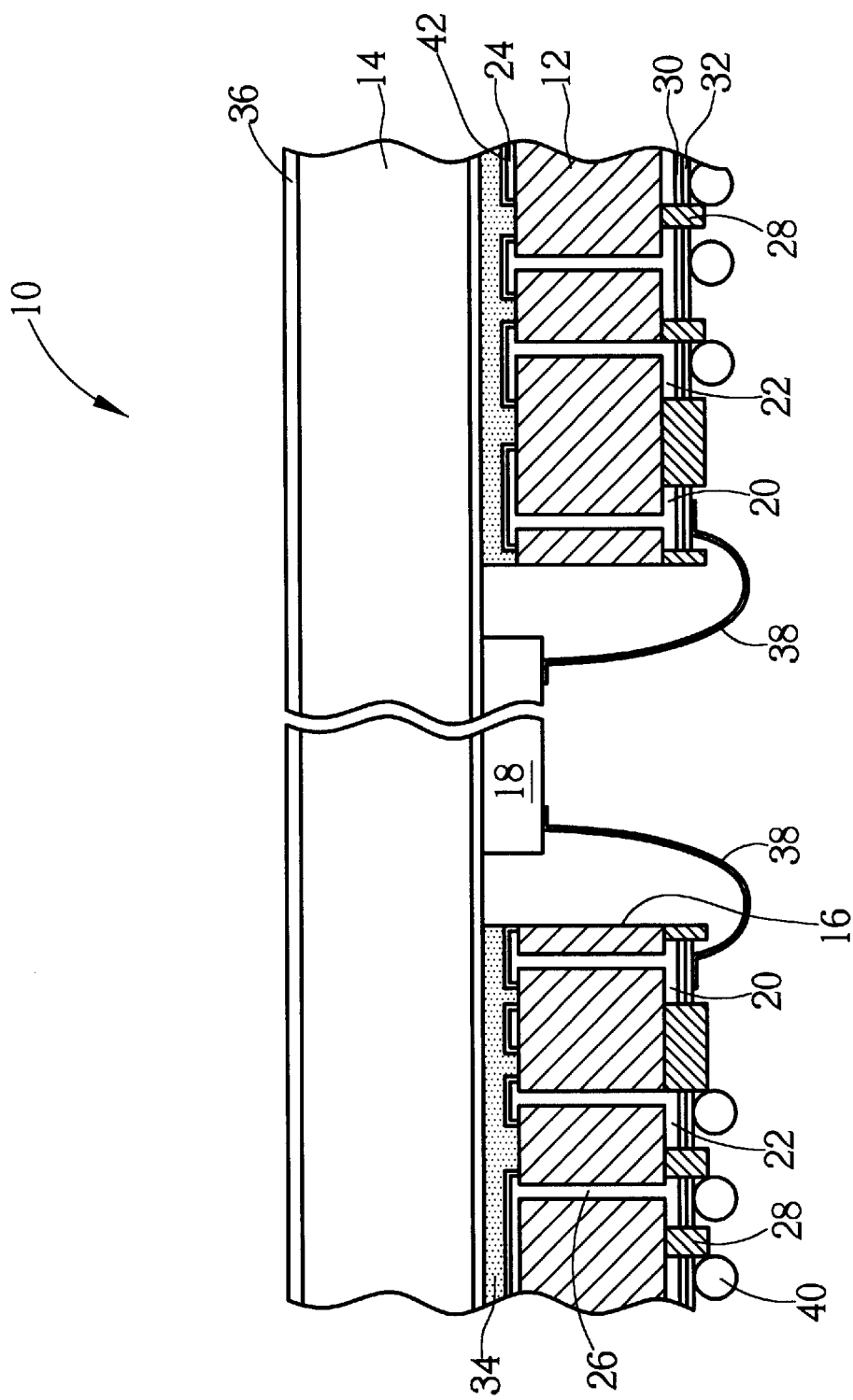
FIG. 2 is a view of a cross-section of the CD-PBGA substrate in FIG. 1.
Figure 3:
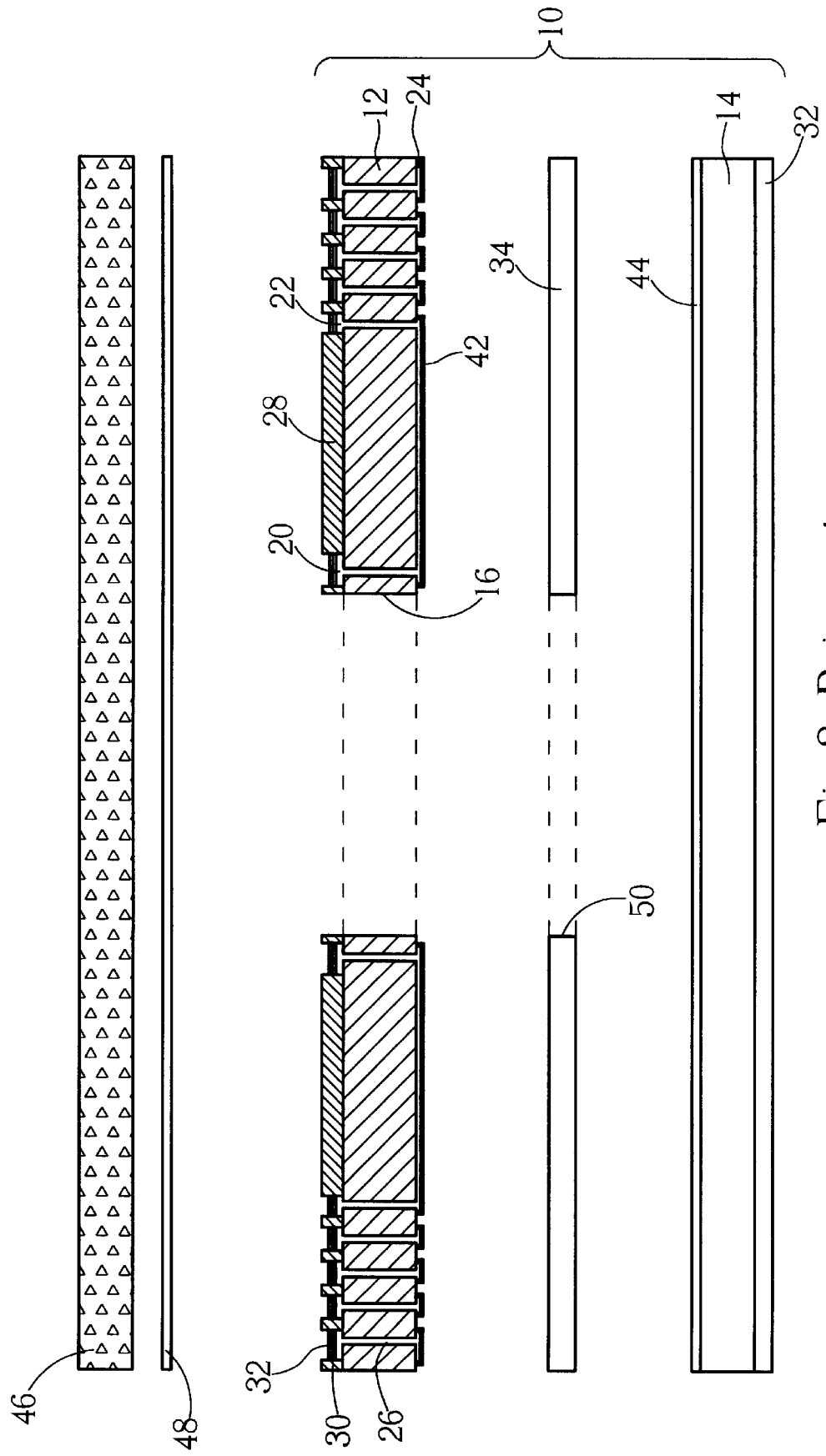
FIG. 3 is a view of a thermal laminating process in manufacturing a CD-PBGA substrate according to the prior art.
Figure 4:
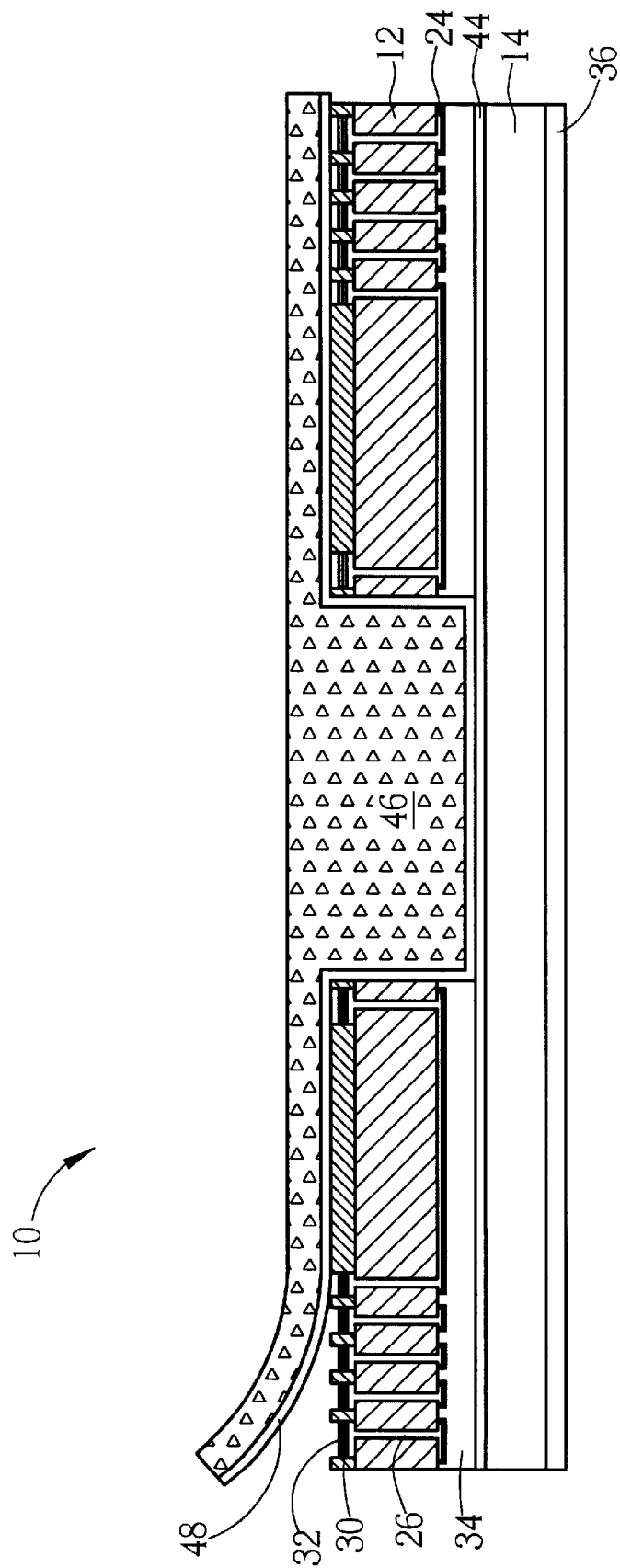
FIG. 4 is a view of fixing and removing a releasing film and filler film in a thermal laminating process according to the prior art.
Figure 5:
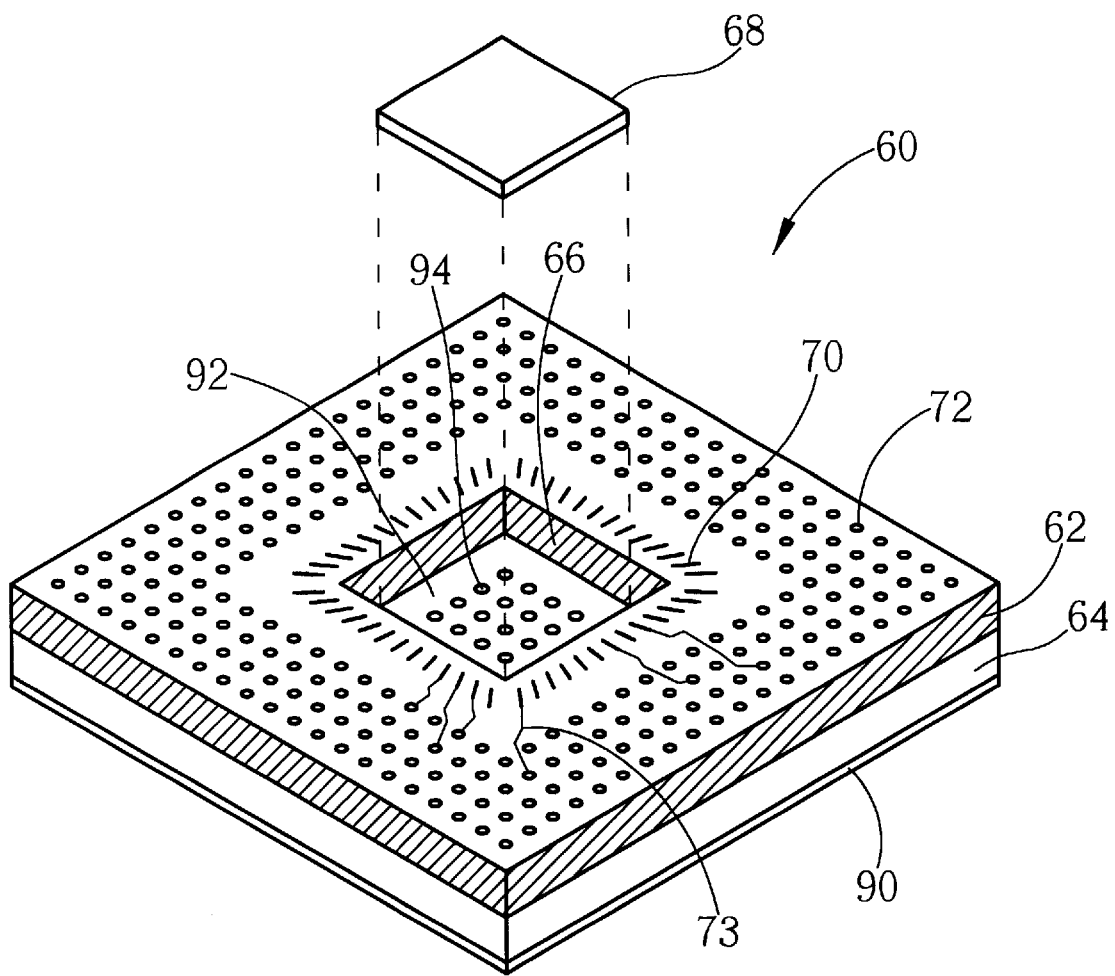
FIG. 5 is a view of a CD-PBGA substrate according to the present invention.
Figure 6:
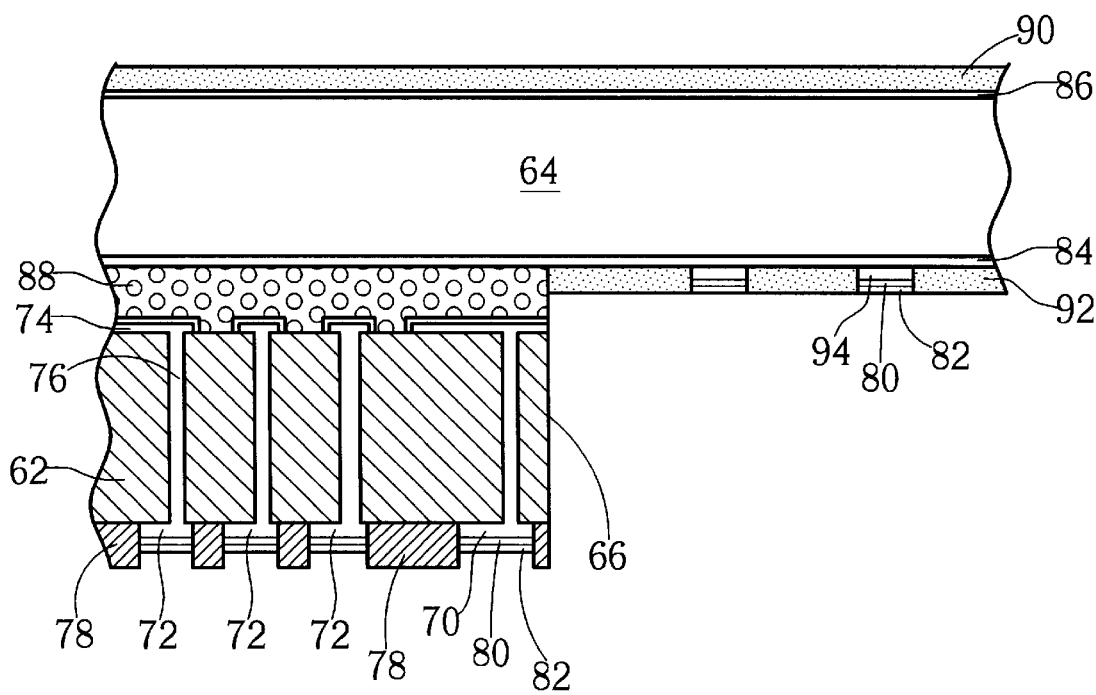
FIG. 6 is a view of a cross-section of the CD-PBGA substrate in FIG. 5.

Please refer to FIG. 5 and FIG. 6. FIG. 5 is a view of a CD-PBGA substrate according to the present invention, and FIG. 6 is a cross-sectional view of the two-layered CD-PBGA substrate shown in FIG. 5. The present invention provides a method of manufacturing two-layered or multi-layered CD-PBGA substrates. Whereas a two-layered CD-PBGA substrate is used as an example in explaining the present invention, the same manufacturing method can be applied to four-layered or other multi-layered CD-PBGA substrates.

As shown in FIG. 5, the two-layered CD-PBGA substrate manufactured according to the present invention comprises an organic substrate 62 and a Cu heat spreader 64. The organic substrate 62 has a squared or rectangular cavity 66 in its center for holding an IC die 68. The organic substrate 62 can be made of an organic material with a high glass transformation temperature (High Tg), such as FR-4.8, FR-5, BT, Driclad, Hitachi 679F, etc. The Cu heat spreader 64 can be made of C151 or C194 Cu alloys with a thickness of 0.25 to 0.5 mm.

As shown in FIG. 5 and FIG. 6, the surface of the two-layered substrate 62 has a plurality of bonding fingers 70, solder ball pads 72, and a plurality of conductive interconnects 73 (FIG. 5 only shows a portion of the conductive interconnects 73). The conductive interconnects 73 electrically connect the bonding fingers 70 to the solder ball pads 72. The opposite side of the organic substrate has a Cu interconnect layer 74. The organic substrate 62 has a plurality of conductive vias 76 for electrically connecting the bonding fingers 70, the solder ball pads 72, and the conductive interconnects 73 to the Cu interconnect layer 74. A solder mask 78 is spread over the surface of the organic substrate 62 to protect the CD-PBGA substrate 60, and to separate and insulate the bonding fingers 70 and the solder ball pads 72 from each other. The solder mask 78 is also spread over the conductive interconnects 73. The surface of each bonding finger 70 and solder ball pads 72 is plated with a Ni finish 80 and with a gold finish 82.

The Cu heat spreader 64 has a laminating side 84 and a heat dissipating side 86. The organic substrate 62 is bound to the Cu heat spreader 64 on the laminating side 84 with a partially solidified liquid-type adhesive layer 88. A black ink layer 90 is painted or coated on the dissipating side 86 of the Cu heat spreader 64 to protect the heat dissipating side 86 of the Cu heat spreader 64 from continuous oxidation, erosion, or being plated with any Ni/Au finish. The black ink layer 90 typically has a thickness of 4 to 8 microns, and the liquid-type adhesive layer 88 typically has a thickness of 20 to 60 microns.

The black ink layer 90 is characterized by its high thermal conductivity and by its good reliability in package reliability tests. S-500 series black ink produced by the Taiyo Ink company, for example, is used in the present invention. The thermal conductivity of the black ink layer 90 is about 1 W/m-K.

The liquid-type adhesive layer 88 is comprised of an adhesive material with a high glass transformation temperature (high-Tg), such as adhesive materials comprised of polyolefin, or of a proper Tg epoxy resin, acrylic resin, Bismaleimide Triazine resin (BT resin), etc. In order to avoid affecting the warpage of the substrate 60, the elastic modulus of the adhesive material should be considered.

The surface of the Cu heat spreader with the cavity 66 has a black ink layer 92 that is 4–8 microns thick. The black ink layer 92 acts as a buffer layer between the epoxy compound (not shown, used for binding the IC die 68 during die attachment process) and the Cu heat spreader 64. It prevents high stress of the IC die 68 from the Cu heat spreader 64 when the whole packaged substrate suffers high temperatures or temperature cycling. The black ink layer 92 has a plurality of heat dissipating pads 94, which occupy 0~90% of the area in the cavity 66, and which conduct heat generated from the IC die 68 to the Cu heat spreader 64. The black ink layer 92 itself has a thermal conductivity of about 1 W/m-K, to rapidly transmit the heat generated from the IC die 68 to the Cu heat spreader. The Ni/Au finish is plated simultaneously on the heat dissipating pads 94, the bonding fingers 70 and the solder ball pads 72. A layer of Ni 80 is plated on their surfaces, and then a layer of Au 82 is plated over the Ni 80.

The method of manufacturing the substrate 60 according to the present invention requires first making an organic substrate 62 and a Cu heat spreader 64, and then to spreading a liquid-type adhesive layer 88 over the Cu heat spreader, and then performing a thermal treatment in order to partially solidify the liquid-type adhesive layer. Finally, the organic substrate 62 and the Cu heat spreader are laminated together.

Figure 7:
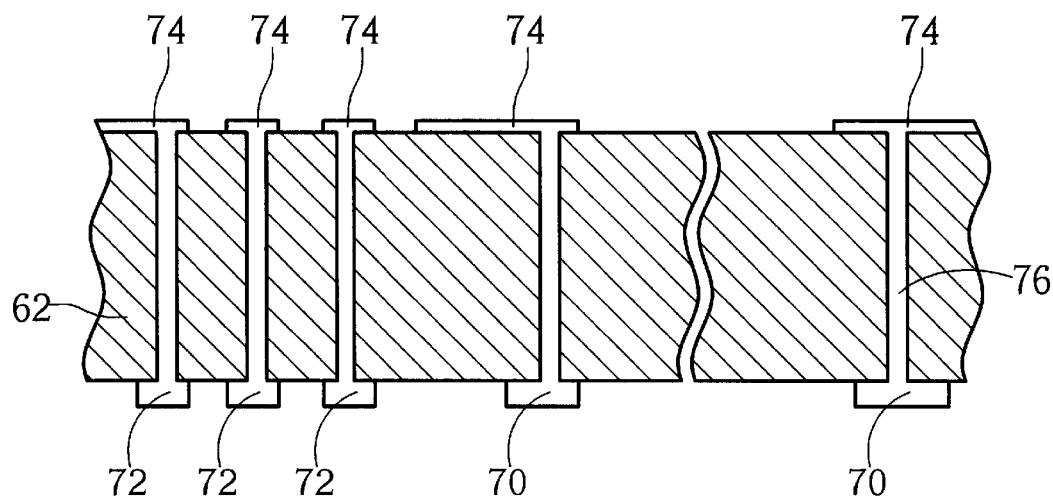
FIG. 7 to FIG. 9 are views of a process of making an organic substrate for a CD-PBGA substrate according to the present invention.
Figure 8:
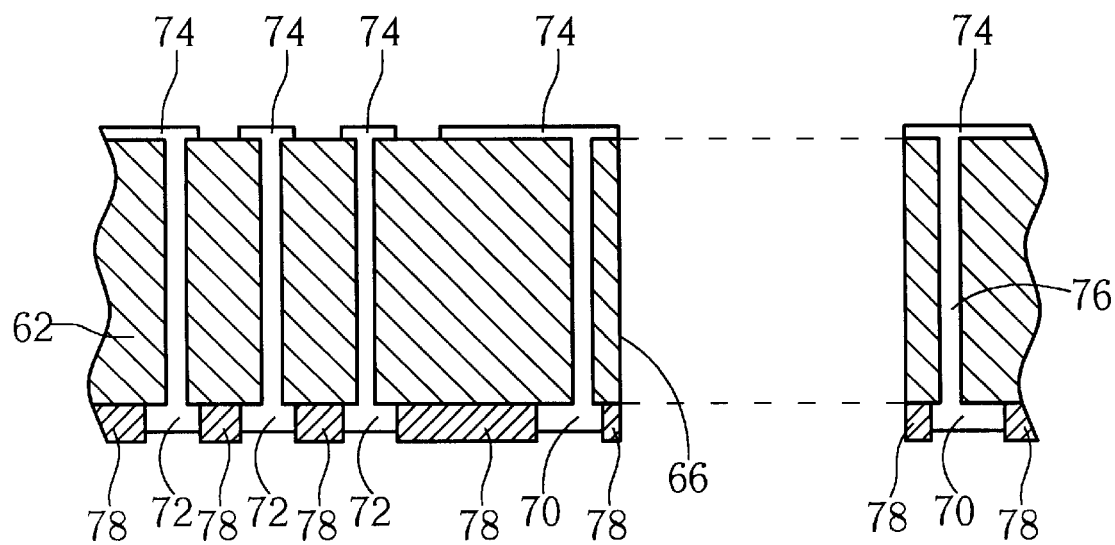
Figure 9:
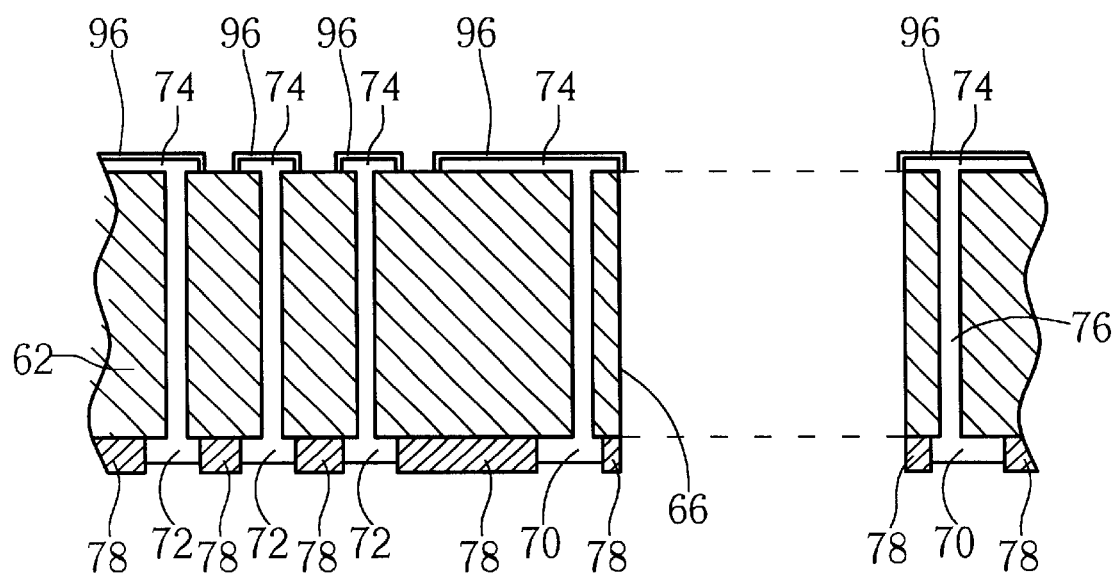

Please refer to FIG. 7 to FIG. 9. FIG. 7 is a view of the process of making the organic substrate 60 of the CD-PBGA substrate 60, using a two-layer substrate as an embodiment. As shown in FIG. 7, in two-layer or multi-layer PCB processes, the organic substrate 62 (without a cavity), the bonding fingers 70, the solder ball pads 72, the conductive interconnects 73, the Cu interconnect layer 74 and the conductive vias 76 are provided. As shown in FIG. 8, the manufacturer spreads a solder mask 78 onto the surface of the organic substrate 62, on the same side as the bonding fingers 70 and the solder ball pads 72, and then forms a pattern for the solder mask 78 by performing photo imaging and etching processes. Using a mechanical routing or punching process, a cavity 66 is formed around the center of the organic substrate 62.

As shown in FIG. 9, after forming the cavity 66, a single-side or a double-side surface pre-treatment process is performed, which coarsens the surface of the organic substrate 62 so as to increase the adhesion of the organic substrate 62 to the Cu heat spreader 64. In the present invention, an oxide layer 96 is formed on the Cu layer 74 of the organic substrate 62 in the surface pre-treatment process. The oxide layer 96 is comprised of black oxide or brown oxide. After the surface pre-treatment process, the manufacturer may optionally perform a thermal treatment process to the organic substrate 62. So as to remove moisture in the organic substrate 62, and to slightly shrink the organic substrate 62. Therefore, the warpage of the CD-PBGA 60 after the thermal laminating process can be improved. Also, the manufacturer may omit the thermal treatment step due to the materials used for the organic substrate, succeeding processes, or other reasons.

Figure 10:
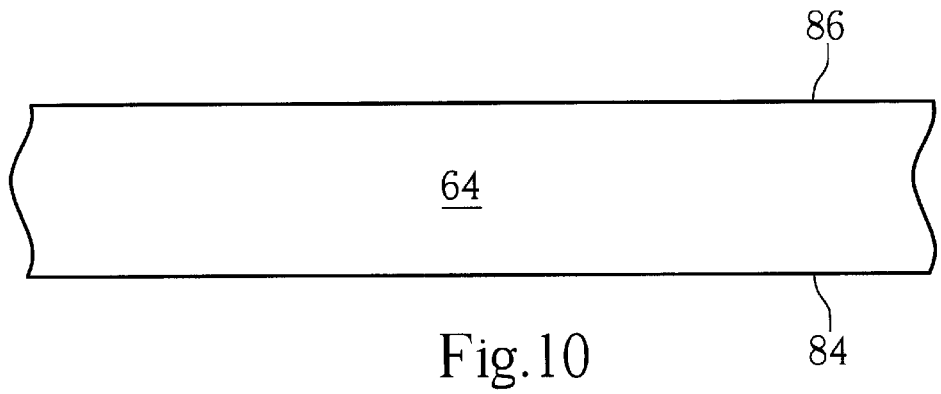
FIG. 10 to FIG. 13 are views of a process of making a Cu heat spreader for a CD-PBGA substrate according to the present invention.
Figure 11:
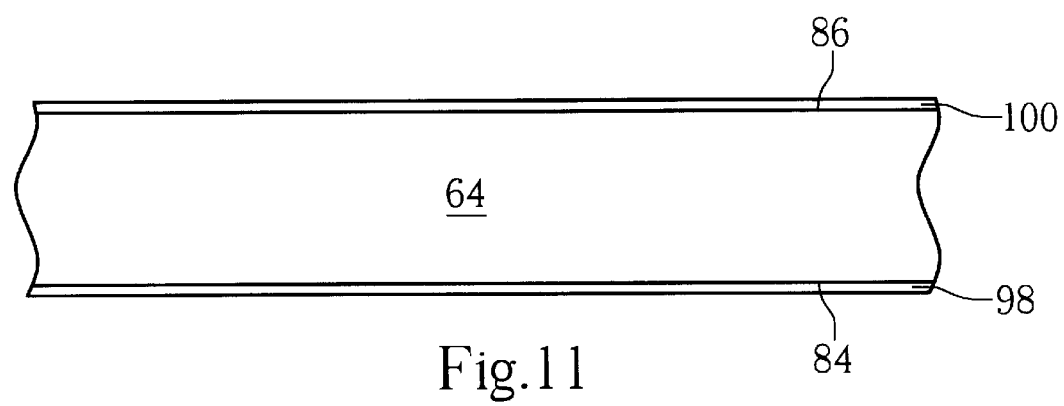

Please refer to FIG. 10 to FIG. 13. FIG. 10 to FIG. 13 show an embodiment of making the Cu heat spreader according to the present invention. The Cu heat spreader 64 can be made simultaneously with the organic substrate 62. In order to facilitate making the Cu heat spreader 64, holes are drilled on a Cu alloy plate, such as C151 or C194, to form a plurality of tooling holes (not shown) for alignment in a later stencil printing process or thermal laminating process. As shown in FIG. 10 and FIG. 11, the Cu heat spreader 64 is made from a Cu alloy plate. First, a double-sided surface pre-treatment is performed to form an oxide layer 98 on the laminating side of the Cu heat spreader, and, at the same time, an oxide layer 100 on the heat dissipating side 86. The oxide layers 98 and 100 comprise black or brown oxide, so as to enhance the surface adhesion of the Cu heat spreader 64.

Figure 12:
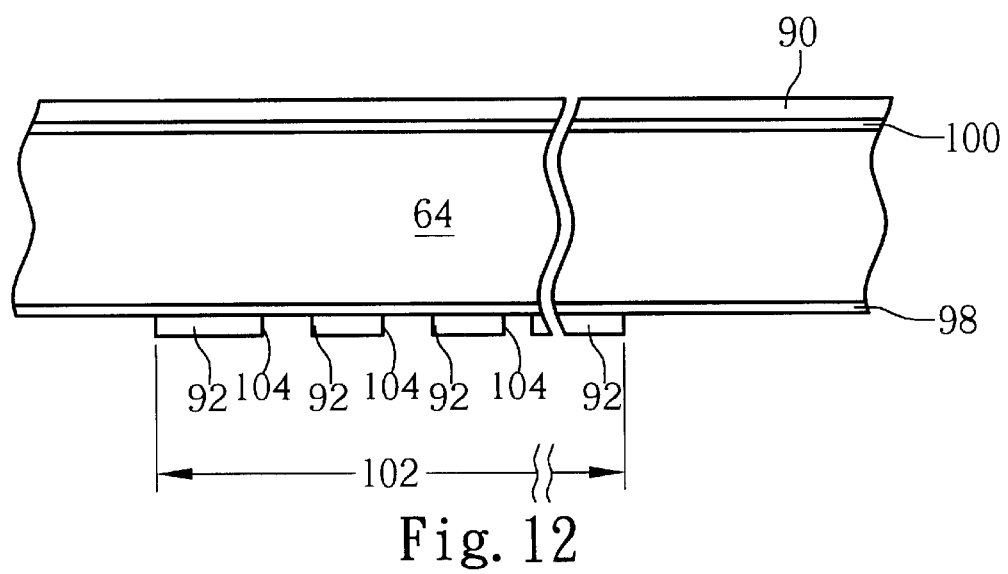

As shown in FIG. 12, after forming the oxide layers 98 and 100, a double sided black ink stencil printing process (or other coating process such as spray coating, ink jet coating and roller coating, etc.) is performed, which forms a black ink layer 90 on the heat dissipating side 86 of the Cu heat spreader 64, and a black ink layer 92 in a predetermined area 102 of the laminating side 84. The predetermined area 102 for holding the IC die 68 corresponds to the size and position of the cavity 66 of the organic substrate 62. A plurality of gaps 104 can be reserved, i.e. expose a plurality of gaps of the copper oxide layer to form a plurality of heat dissipating pads 94.

In the black ink stencil printing process, the black ink layer is printed with a blank printing mesh plate (not shown), with a mesh number of 120 to 150/cm. The black ink layer 92 is printed with another printing mesh plate, whose particular pattern has been made to ensure that the black ink layer 92 is printed in the predetermined area 102. After the black ink stencil printing process, a baking and curing process are performed to solidify the black ink layers 90 and 92 at a proper temperature and for a proper duration of heating time.

Figure 13:
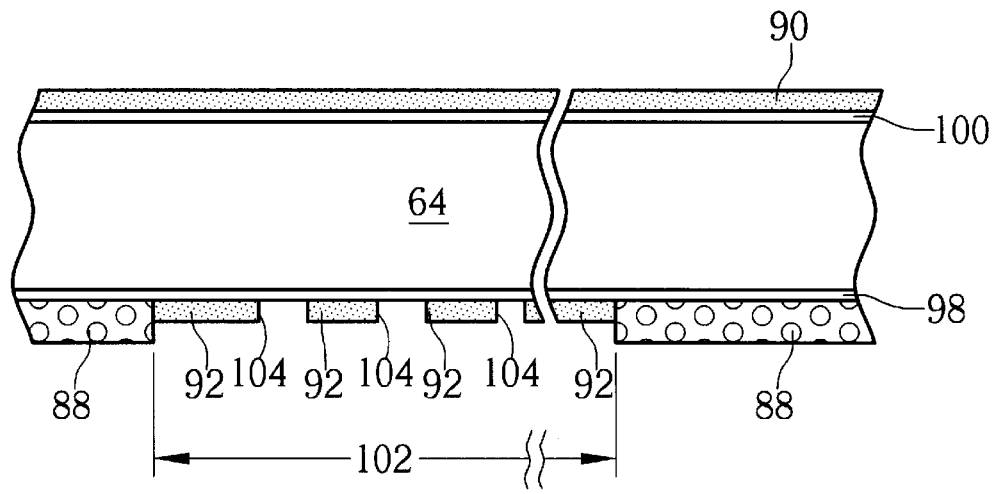

As shown in FIG. 13, after forming the black ink layers 90 and 92, a liquid-type adhesive stencil printing process is performed to print a liquid adhesive material on the oxide layer 98 outside the predetermined area 102 of the Cu heat spreader 64, thus forming a solidified liquid-type adhesive layer 88 after drying. If a proper thickness is not achieved after the first printing process, the manufacturer may, after a baking process, perform a second liquid adhesive stencil printing process (or repeat the same process several times) to achieve the desired thickness of the solidified liquid-type adhesive layer 88. Then, a partially-curing process is performed, at a proper baking temperature and for a proper duration of time, to decrease the lamination fluidity of the solidified liquid-type adhesive layer 88. This prevents the adhesive layer 88 from flowing into the predetermined area 102 of the Cu heat spreader during the laminating process. After a quality control inspection, the Cu heat spreader 64 is laminated onto the organic substrate 62.

Figure 14:
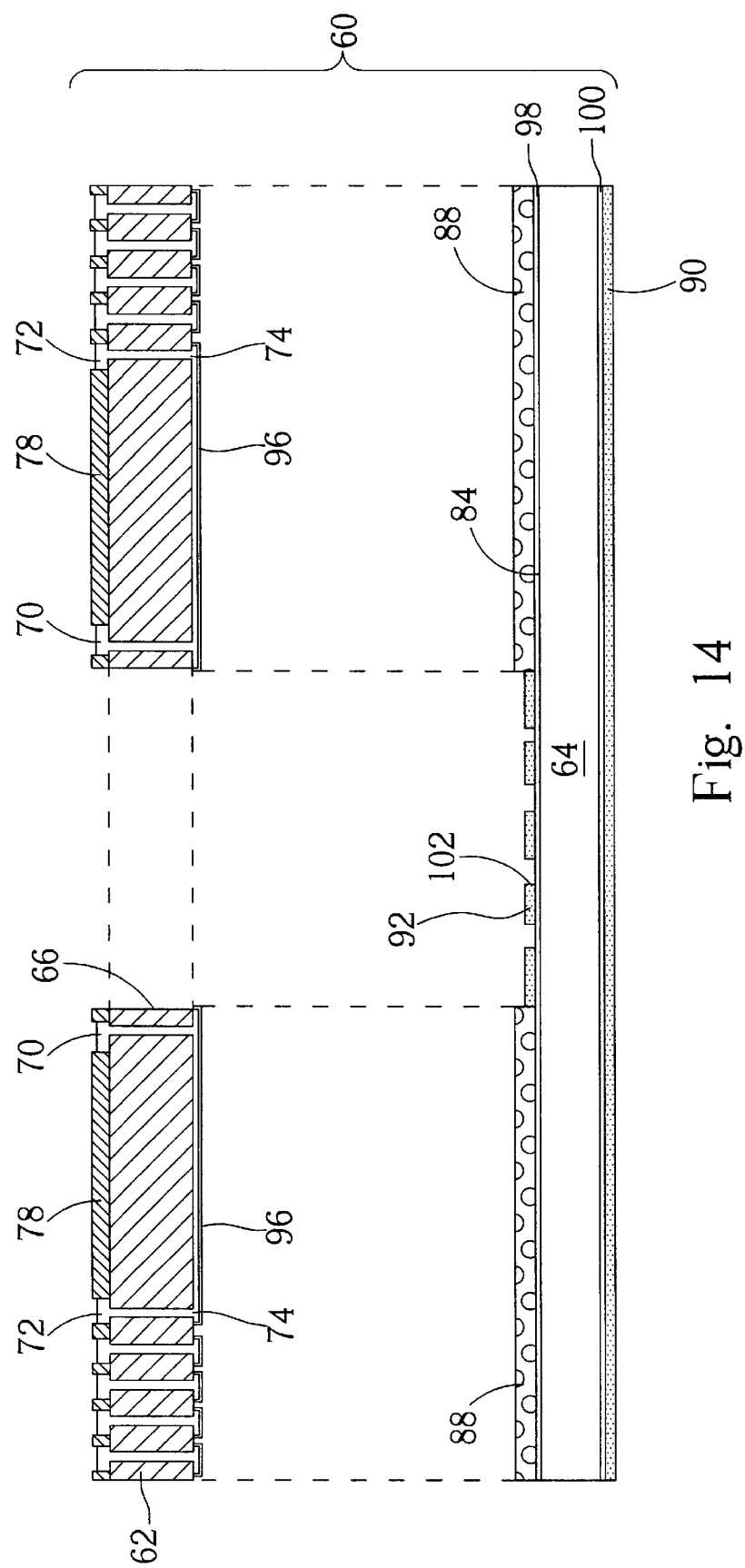
FIG. 14 is a view of a thermal laminating process according to the present invention.

Please refer to FIG. 14, which shows the thermal laminating process according to an embodiment of the present invention. After the organic substrate 64 and the Cu heat spreader 64 have been made as shown in FIG. 9 and FIG. 13 respectively, a thermal laminating process is performed to laminate, with the help of the solidified liquid-type adhesive layer 88, the oxide layer 96 of the organic substrate 62 onto the laminating side of the Cu heat spreader 64. The pressure during the thermal laminating process is between 20 to 30 Kg/cm$^2$, and the temperature is preferably between 150 to 200° C. After the thermal laminating process, a thermal treatment is performed to further cure the solidified liquid-type adhesive layer 88 and to control for warpage of the CD-PBGA substrate 60. The thermal treatment process can be omitted depending on the thermal laminating process or other factors.

After the heat treatment, a Ni/Au plating process is performed. A Ni finish 80 is plated onto each of the fingers 70 and pads 72 of the organic substrate 62, and the gaps 104 on the Cu heat spreader. A gold finish 82 is then plated onto the Ni-plated finish 80. Electroplating or chemical immersion can perform the Ni/Au plating process.

During mass production of the CD-PBGA, a plurality of CD-PBGA substrates are provided on a substrate sheet. After the manufacturing process described above has been performed on the substrate sheet, the manufacturer can drill in the unused area of the substrate sheet a plurality of tooling holes with an X-ray tooling hole drill, or with a regular mechanical drill. This drilling process may be omitted, however, depending upon the design of the alignment tooling holes of the organic substrate and the Cu heat spreader 64 or on other factors.

The substrate sheet is then cut into many singulated CD-PBGA substrates 60. The CD-PBGA substrates may be cut using a router or a precision saw. After cutting, each CD-PBGA substrate 60 is cleaned and inspected to ensure conforming to industrial standards.

Figure 15:
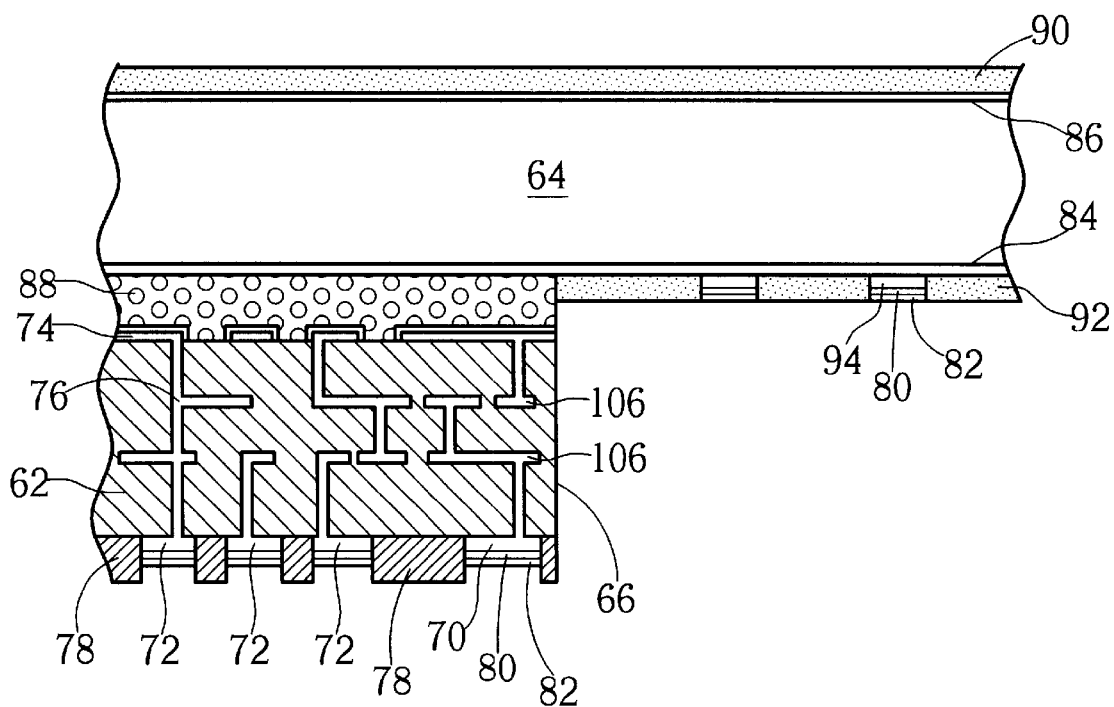
FIG. 15 is a view of a cross section of a four-layered CD-PBGA substrate according to the present invention.

Please refer to FIG. 15, which is a cross-sectional view of a four-layered CD-PBGA substrate according to an embodiment of the present invention, with a preferred substrate profile as shown in FIG. 5. There are two Cu inner layers 106 shown in FIG. 15. The composition of the Cu heat spreader 64 is not altered. The Cu layers 74 and 106, when connected with the conductive vias 76, are electrically connected to the bonding fingers 70 and the solder ball pads 72 of the organic substrate 62. The manufacturing process of four-layered CD-PBGA substrates is the same as the process described above according to the present invention, with the additional manufacturing process of the inner layers of the four-layered substrate.

The present invention discloses utilizing the liquid-type adhesive layer 88 to laminate the organic substrate 62 to the Cu heat spreader 64, and applying the black ink layers 90 and 92 as a protective and a buffer layer respectively. Additionally, the Ni/Au plating process on the fingers 70 and pads 72 is performed after the thermal laminating process. As a result, the present invention has the following advantages:

1. Performing the Ni/Au plating process after the thermal laminating process can reduce or avoid the contamination or deterioration of the surface of the gold-plated finish 82 by other sources.
2. The black ink layer 90 on the heat spreading side 86 of the Cu heat spreader is thin (such as 4 to 8 microns), and its thermal conductivity (such as k=1 W/m-K) is high. Consequently, the present invention improves the heats dissipation of the Cu heat spreader 64. The black ink layer 92 on the laminating side 84 of the Cu heat spreader 64 serves as a buffer layer between the IC die 68 and the Cu heat spreader 64 so as to reduce the unmatched thermal expansion problem therein, keeping the IC die 68 tightly adhered to the Cu heat spreader 64 even when suffering a high-temperature environment or a temperature cycling. The black ink layer 92 has not only great thermal conductivity characteristics, but it also has a plurality of heat dissipating pads 94 that help to conduct the heat generated from the IC die 68 to the Cu heat spreader 64.

3. The black ink layer 90 on the Cu heat spreader 64 is formed by stencil printing (or other coating process such as spray coating, ink jet coating, roller coating, etc.), without requiring a tape or film for a single-sided Ni plating process on the opposite side of the Cu heat spreader, which reduces the processing time and materials. The liquid-type adhesive layer 88 is formed using a stecil printing process, so the adhesive layer 88 is spread precisely in the desired region of the Cu heat spreader 64.

4. Instead of an adhesive film or prepregs, the present invention uses the solidified liquid-type adhesive layer to bind the organic substrate 62 and the Cu heat spreader 64. The present invention eliminates the need for a process of creating a cavity 50 on the adhesive layer 34, a process which is not only difficult to perform but also expensive. The partial curing process keeps the lamination fluidity of the solidified liquid-type adhesive layer 88 under control. This prevents the solidified liquid-type adhesive layer 88 from leaking into the predetermined area 102 of the Cu heat spreader 64 during the thermal laminating process. Otherwise, no release film and no filler film is required during the thermal laminating process of the present invention. In other words, the solidified liquid-type adhesive layer 88 simplifies the manufacturing process and reduces production costs.

In summary, the advantages of the present invention lie in the simplification of the manufacturing process and the reduction of production costs. The efficiency and reliability of the product is thus improved as well.

Comparing with the CD-PBGA substrate 10 made according to the prior art, the present invention adopts the stencil printing process (or other coating process such as spray coating, ink jet coating, roller coating, etc.) in forming the black ink layer 90, which acts as a protective layer for the Cu heat spreader 64. This solves the stress problem caused by the Ni-plated finish 36 on the Cu heat spreader 64, and eliminates the long and complicated procedure of fixing and removing a process-needed tape. According to the present invention, the black ink layer 92 is formed within the cavity 66 of the CD-PBGA substrate 60, so as to reduce the stress problem that is caused by the epoxy compound (used for binding IC die 18) and by the Cu heat spreader 14 under high temperatures, and which loosens the IC die 18 from the cavity. Additionally, the Ni/Au plating process in the present invention is performed after the thermal laminating process, reducing the possibility of contamination or destruction of the surface of the gold plated finish 82. Finally, instead of the traditional sticky adhesive film 34, the releasing film 48 and the filler film 46, the liquid adhesive film 88 is used to bind the organic substrate 62 to the Cu heat spreader 64, simplifying the manufacturing process and reducing production costs.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of manufacturing a substrate for packaging a semiconductor device, the substrate comprising:
    an organic substrate comprising a plurality of conductive pads positioned on the surface of the organic substrate, a first copper layer positioned on the opposite surface of the organic substrate, and a plurality of conductive vias penetrating the organic substrate, wherein the first copper layer and the vias functioning to electrically connect the conductive pads; and a heat spreader comprising a laminated side and a heat spreading side, the heat spreader being formed of copper alloys;

the method comprising the steps of:
        forming a cavity in a middle region of the organic substrate;
        performing a first surface pre-treating process to form a first oxide layer on the surface of the first copper layer to increase the adhesion of the surface of the organic substrate;
        performing a second surface pre-treating process to form a second oxide layer on the laminating side of the heat spreader to increase the adhesion of the heat spreader;
        forming a plurality of heat dissipating pads inside a predetermined region on the laminating side of the heat spreader;
        performing a first stencil printing process to form a liquid-type adhesive layer outside the predetermined area on the second oxide layer, wherein the size and the position of the predetermined area corresponds to the cavity of the organic substrate that is to receive an IC die;
        performing a first curing process to reduce the lamination fluidity of the liquid-type adhesive layer on the heat spreader; and
        performing a thermal laminating process to bond the first oxide layer of the organic substrate to the laminating side of the heat spreader.

2. The method of claim 1 wherein a nickel (Ni)/gold (Au) plating process is performed after the thermal laminating process to form a nickel layer on the conductive pads of the organic substrate, and a gold layer on the nickel layer.

3. The method of claim 1 wherein a second stencil printing process is performed between the second surface pre-treating process and the first stencil printing process, the second stencil printing process forming a buffer layer in the predetermined area of the heat spreader, and the buffer layer increases the adhesion of the IC die to the heat spreader at high temperature.

4. The method of claim 3 wherein the buffer layer is black ink layer.

5. The method of claim 3 wherein a second curing process is performed to solidify the buffer layer.

6. The method of claim 3 wherein the heat dissipating pads are positioned in the buffer layer to transmit heat generated by the IC die to the heat spreader.

7. The method of claim 6 wherein the heat dissipating pads cover 0 to 90 percent of the surface of the predetermined area.

8. The method of claim 6 wherein the heat dissipating pads are formed from a nickel layer and a gold layer deposited on the heat spreader.

9. The method of claim 8 wherein the step of forming the heat dissipating pads comprises the following steps:
    performing a nickel/gold plating process to form the nickel layer on both the conductive pads of the organic substrate and on the heat dissipating pads of the heat spreader; and
    forming a gold layer on the nickel layer.

10. The method of claim 1 wherein the second surface pre-treating process further forms a third oxide layer on the heat spreading side of the heat spreader.

11. The method of claim 10 wherein a third stencil printing process is performed between the second surface pre-treating process and the first stencil printing process to form a passivation layer on the heat spreading side of the heat spreader.

12. The method of claim 11 wherein the passivation layer is formed by a liquid ink layer.

13. The method of claim 11 wherein a third curing process is performed after the third stencil printing process to solidify the passivation layer.

14. The method of claim 1 wherein the organic substrate further comprises at least a second copper layer, and the first copper layer, the second copper layer, and the vias electrically connect the conductive pads of the organic substrate.

15. The method of claim 1 wherein a thermal treating process is performed between the first surface pre-treating process and the thermal laminating process to remove moisture in the organic substrate and to slightly shrink the organic substrate so as to control the warpage of the organic substrate after the thermal laminating process.

16. The method of claim 1 wherein a thermal treating process is performed after the thermal lamination process to further cure the liquid-type adhesive layer and to adjust the warpage of the substrate.

17. The method of claim 1 wherein the substrate is a cavity-down plastic ball grid array (CD-PBGA) substrate.

* * * * *